United States Patent
Dehe et al.

(10) Patent No.: US 10,231,061 B2
(45) Date of Patent: Mar. 12, 2019

(54) SOUND TRANSDUCER WITH HOUSING AND MEMS STRUCTURE

(71) Applicant: Infineon Technologies AG

(72) Inventors: Alfons Dehe, Reutlingen (DE); Ulrich Krumbein, Rosenheim (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/581,744

(22) Filed: Apr. 28, 2017

(65) Prior Publication Data

US 2018/0317021 A1 Nov. 1, 2018

(51) Int. Cl.
| H04R 19/00 | (2006.01) |
| H04R 19/04 | (2006.01) |
| H04R 7/04 | (2006.01) |
| B81B 3/00 | (2006.01) |

(52) U.S. Cl.
CPC ........... *H04R 19/04* (2013.01); *B81B 3/0089* (2013.01); *H04R 7/04* (2013.01); *H04R 19/005* (2013.01); *B81B 2201/0257* (2013.01); *H04R 2201/003* (2013.01)

(58) Field of Classification Search
CPC .................................................. B81B 7/0009
See application file for complete search history.

(56) References Cited

U.S. PATENT DOCUMENTS

| 5,812,496 | A | 9/1998 | Peck |
| 6,859,542 | B2 | 2/2005 | Johannsen et al. |
| 9,011,776 | B2 | 4/2015 | Ziglioli et al. |
| 9,438,979 | B2 | 9/2016 | Dehe |
| 2007/0003081 | A1 | 1/2007 | Ram et al. |
| 2008/0155801 | A1 | 7/2008 | Imanaka |
| 2009/0067659 | A1* | 3/2009 | Wang .................. H04R 19/005 381/355 |
| 2010/0032775 | A1* | 2/2010 | Morris, III .......... B81C 1/00333 257/415 |
| 2010/0322452 | A1 | 12/2010 | Ladabaum et al. |
| 2013/0193533 | A1 | 8/2013 | Vos et al. |
| 2013/0223654 | A1 | 8/2013 | Dehe et al. |
| 2014/0061892 | A1* | 3/2014 | Ziglioli ................. B81B 7/0058 257/704 |
| 2014/0197501 | A1 | 7/2014 | Dehe |
| 2015/0001647 | A1 | 1/2015 | Dehe et al. |
| 2018/0048951 | A1* | 2/2018 | Zheng ..................... H04R 1/04 |

FOREIGN PATENT DOCUMENTS

WO    WO2016176993 A1 * 10/2016

* cited by examiner

*Primary Examiner* — James K Mooney

(74) *Attorney, Agent, or Firm* — Slater Matsil, LLP

(57) ABSTRACT

A sound transducer includes a housing with a sound port and a MEMS structure disposed in an interior space of the housing. The MEMS structure and the sound port are acoustically coupled to each other. The MEMS structure separates a front volume from a back volume of the housing. At least one vent hole of the MEMS structure allows a gas exchange between the front volume and the back volume. The sound port allows a liquid to enter the front volume. Further, the MEMS structure prevents liquid from entering the back volume.

25 Claims, 3 Drawing Sheets

SOUND TRANSDUCER WITH HOUSING AND MEMS STRUCTURE

TECHNICAL FIELD

The disclosure relates in general to a sound transducer. The disclosure especially refers to a media resistant vacuum microphone.

BACKGROUND

Different embodiments of MEMS (Microelectromechanical systems) structures are used as pails of microphones that are an example for sound transducers. Known are e.g. condenser, piezoelectric or vacuum microphones.

SUMMARY

In an embodiment, a sound transducer includes a housing and a MEMS structure. A sound port is disposed in the housing. The MEMS structure is disposed in an interior space of the housing. The MEMS structure and the sound port are acoustically coupled to each other. The MEMS structure separates a front volume of the housing from a back volume of the housing. At least one vent hole of the MEMS structure allows a gas exchange between the front volume and the back volume. The sound port allows a liquid to enter the front volume. The MEMS structure prevents liquid from entering the back volume.

In a different embodiment, a sound transducer includes a housing and a MEMS structure. At least one vent hole is disposed in a diaphragm of the MEMS structure. A sidewall of the vent hole includes a hydrophobic structure.

The details of one or more embodiments are set forth in the accompanying drawings and the description below. Other features, objects, and advantages will be apparent from the description and drawings, and from the claims.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present disclosure provides many applicable concepts that can be embodied in a wide variety of specific contexts. The specific embodiments discussed are merely illustrative of specific ways to make and use the disclosure, and do not limit the scope.

The present description refers to embodiments in a specific context, namely sensors or microphones, e.g. (near-) vacuum microphones and/or (near-) vacuum speakers. Other embodiments refer to other MEMS structures such as pressure sensors, RF MEMS, accelerometers, actuators or loudspeakers.

Figure 1:
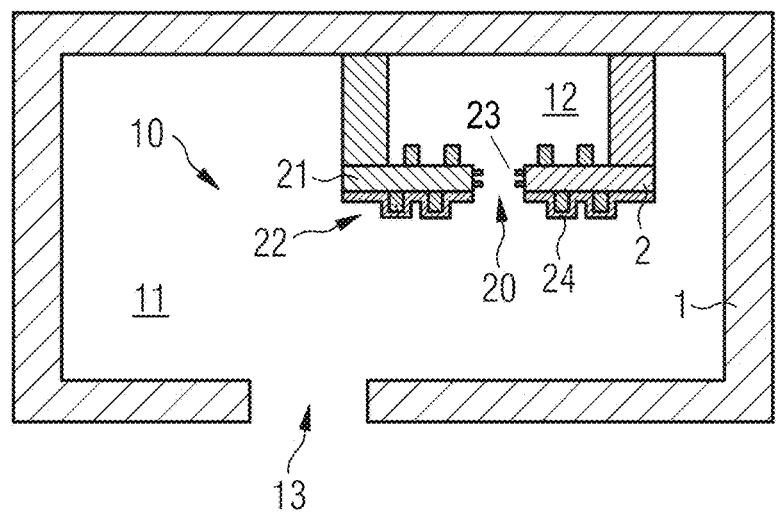
FIG. 1 shows a schematic section of a first embodiment of a sound transducer.

FIG. 1 shows a sound transducer comprising a housing 1 and a MEMS structure 2. The sound transducer is in one embodiment a microphone and is in a different embodiment a loudspeaker. The MEMS structure 2 is configured for converting between soundwaves and electrical signals. The MEMS structure 2 is disposed within the interior space 10 of the housing 1.

The interior space 10 includes a front volume ii and a back volume 12. The front volume 11 is connected with the external environment surrounding the housing 1 by a sound port 13 in the housing 1. The MEMS structure separates the front volume 11 and the back volume 12 from each other. The MEMS structure 2 and the sound port 13 are acoustically coupled to each other. Further, the MEMS structure 2 includes a diaphragm 21 with a vent hole 20. The vent hole 20 allows a gas exchange between the front volume 11 and the back volume 12.

The sound port 13 allows a liquid to enter the front volume but the MEMS structure 2 prevents the liquid from entering the back volume 12. Thus, a liquid may enter the front volume ii but cannot enter the back volume 12, thereby reducing, and possibly eliminating, the risk that a liquid e.g. water damages the electrical components of the sound transducer due to freezing or salt etc. In a further embodiment, the MEMS structure 2 even provides a liquid tight seal between the front volume ii and the back volume 12.

In the shown embodiment, a part of the surface 22 of the MEMS structure 2 is covered with a hydrophobic structure 23. Additionally, at least a portion of the surface of the MEMS structure 2 facing the sound port 13 and adjacent to the front volume 11 is covered with a hydrophobic coating 24. In the shown embodiment, only the surface facing the sound port 13 is covered with the hydrophobic coating 24. The hydrophobic coating includes in an embodiment a self-assembled monolayer and/or thin hydrophobic $Si_3N_4$ and/or FDTX. As shown in FIG. 1, the hydrophobic structures 23 may also be located on the sidewall of the vent hole 20. The hydrophobic coating 24 as well as the hydrophobic structure 23 effectively prevent a liquid from entering the back volume by increasing the pressure level needed in order to overcome the additional surface tension.

In an embodiment, a super-hydrophobic structure is generated and/or a super-hydrophobic coating is used. Under superhydrophobic circumstances, contact angles of a water droplet exceed 150° and the roll-off angle is less than 10° (referred to as Lotus effect).

Figure 2:
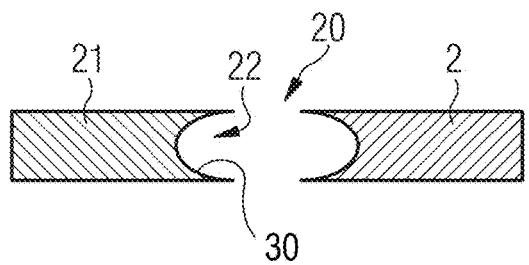
FIG. 2 shows a detail of an embodiment of a part of a MEMS structure.

A detail of an embodiment of a diaphragm 21 is shown in FIG. 2. Depending on the configuration of the sound transducer, the diaphragm 21 may be either a membrane or a back plate. The sidewall of the vent hole 20 includes the hydrophobic structure 30. Thus, the sidewall of the vent hole 20 is structured as a hydrophobic structure 30. Here, the sidewall of the vent hole 20 is in the form of a pillar with an inwardly-dented or concave top.

Figure 3:
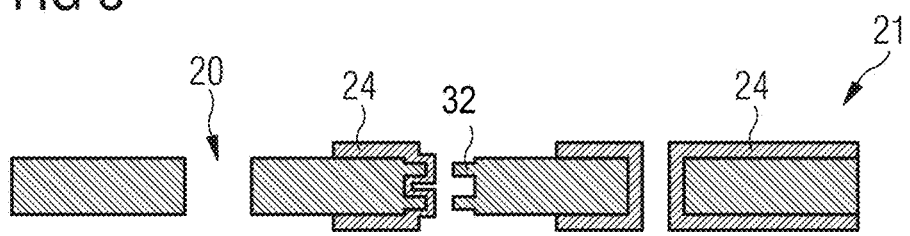
FIG. 3 shows details of different embodiments of pails of a MEMS structure.

FIG. 3 shows different embodiments of vent holes 20. The embodiment on the left reduces the diameter of the vent hole 20. This is part of an embodiment in which the diaphragm includes not one single vent hole but a plurality of smaller vent holes that have higher surface tension due to their smaller diameter. The vent hole 20 in the middle has two pillars as a hydrophobic structure 32 on the sidewall. A part of the sidewall and the respective hydrophobic structure 32 is also covered with the hydrophobic coating 24. The sidewall of the vent hole 20 on the right-hand side is covered with the hydrophobic coating 24.

Figure 4:
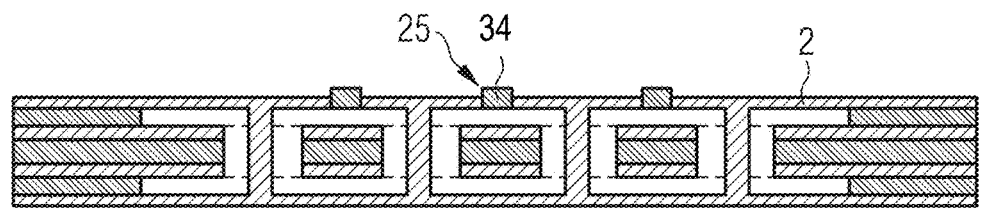
FIG. 4 gives a schematic section of an embodiment of a MEMS structure.

FIG. 4 shows a double-membrane MEMS structure 2 with two membranes and electrode elements between the two membranes. On—the here upper—surface are three pillars of a hydrophobic structure 34. The pillars close manufacture holes 25 used during at least one step of the production of the MEMS structure 2 and especially of the electrode elements within the MEMS structure 2. Thus, the pillars of the hydrophobic structure 34 serve also as sealing plugs of the MEMS structure 2.

Figure 5:
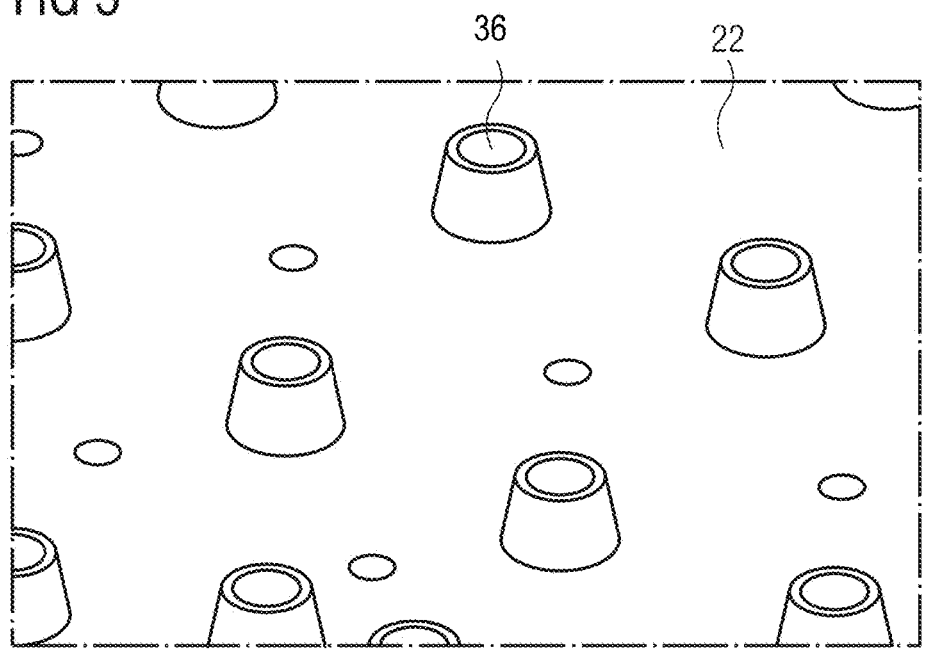
FIG. 5 shows part of a top view of a MEMS structure.

A hydrophobic structure 36 with a plurality of cylindrical pillars is shown in FIG. 5. The pillars of the hydrophobic structure 36 are located on the surface 22 of the MEMS structure and have a convex top. The shape and distribution of the pillars provide surface roughness to the surface 22.

The material of the pillars preferably includes oxides, Silicon nitrides or Poly Si. The edges of the pillars are preferably sharp and/or have corners (square, triangle . . . ). The density, form and height of the pillars depend on the effect to be achieved concerning the liquid tight seal. Further, the shown pillars have a height which is in the same order of the spacing between the pillars. In an embodiment, groups of a given number of pillars have smaller distances to each other than to other pillars. Thus, in this embodiment some pillars are clustered. Typical parameter values concerning the shape and distribution of the pillars are: pitch (10 to 5) μm, diameter (3 to 1) μm and height (0.5 to 5) μm.

Figure 6:
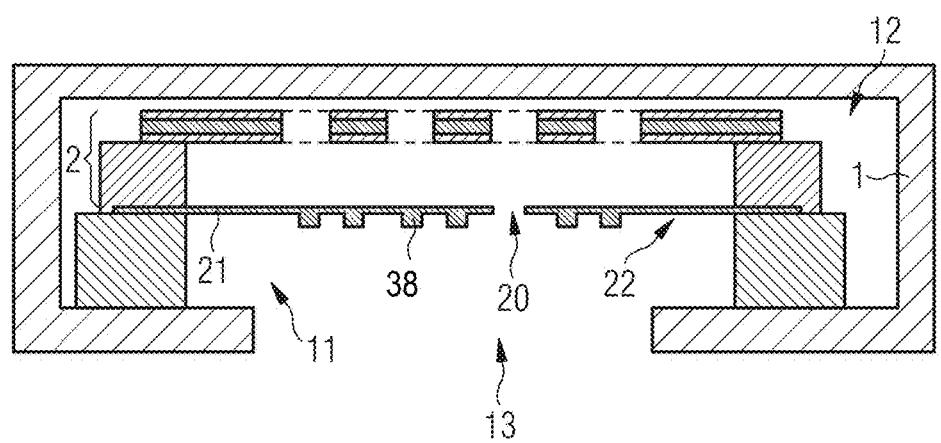
FIG. 6 gives a schematic section of a part of a second embodiment of a sound transducer.

The MEMS structure 2 of the sound transducer shown in FIG. 6 also includes a double-membrane MEMS structure 2 located opposite to a diaphragm 21 with a vent hole 20. The sound port 13 in the housing 1 has—compared to the size of the MEMS structure 2—a quite large diameter and allows a liquid to enter the front volume 11. The MEMS structure 2 includes a hydrophobic structure 38 disposed only at the surface 22 facing the sound port 13. The hydrophobic structure 38 prevents a liquid from entering the back volume 12 which in this embodiment includes the interior space of the MEMS structure 2.

In the following some aspects of different embodiments are given.

In accordance with a first aspect, a sound transducer may include a housing and a MEMS structure, wherein a sound port is disposed in the housing, wherein the MEMS structure is disposed in an interior space of the housing, wherein the MEMS structure and the sound port are acoustically coupled to each other, wherein the MEMS structure separates a front volume of the housing from a back volume of the housing, wherein at least one vent hole of the MEMS structure allows a gas exchange between the front volume and the back volume, wherein the sound port allows a liquid to enter the front volume, and wherein the MEMS structure prevents liquid form entering the back volume.

In accordance with a second aspect when referring back to the first aspect, the MEMS structure provides a liquid tight seal between the front volume and the back volume.

In accordance with a third aspect when referring back to the first aspect, the vent hole may be disposed in a diaphragm of the MEMS structure.

In accordance with a fourth aspect when referring back to the third aspect, the diaphragm may be a membrane or a back plate.

In accordance with a fifth aspect when referring back to any of the foregoing aspects, at least a part of a surface of the MEMS structure adjacent the front volume may be covered with a hydrophobic coating.

In accordance with a sixth aspect when referring back to the fifth aspect, the hydrophobic coating may include a self-assembled monolayer.

In accordance with a seventh aspect when referring back to any of the foregoing aspects, at least a part of a surface of the MEMS structure facing the sound port may include a hydrophobic structure.

In accordance with an eighth aspect when referring back to the seventh aspect, the hydrophobic structure may include a plurality of pillars.

In accordance with a ninth aspect when referring back to the eighth aspect, the plurality of pillars may close manufacturing holes of the MEMS structure used for at least one manufacturing step of the MEMS structure.

In accordance with a tenth aspect when referring back to any of the foregoing aspects, a sidewall of the vent hole may include a hydrophobic structure.

In accordance with an eleventh aspect when referring back to the tenth aspect, the hydrophobic structure is compromised by the sidewall in the form of pillars with inwardly-dented or concave tops.

In accordance with a twelfth aspect when referring back to any of the foregoing aspects, the vent hole may belong to a plurality of vent holes that may be disposed in a diaphragm of the MEMS structure, and the plurality of vent holes may allow the gas exchange be-tween the front volume and the back volume.

In accordance with a thirteenth aspect when referring back to the twelfth aspect, a size of the vent holes may prevent passage of liquid through the vent holes.

In accordance with a fourteenth aspect, a sound transducer may include a housing and a MEMS structure, wherein at least one vent hole is disposed in a diaphragm of the MEMS structure, and wherein a sidewall of the vent hole includes a hydrophobic structure.

In accordance with a fifteenth aspect when referring back to the fourteenth aspect, the hydrophobic structure may include a plurality of pillars.

In accordance with a sixteenth aspect when referring back to the fourteenth or to the fifteenth aspect, the sidewall of the vent hole may be made as the hydrophobic structure.

In accordance with a seventeenth aspect when referring back to any of the fourteenth to the sixteenth aspect, the diaphragm may be a membrane or a back plate.

In accordance with an eighteenth aspect when referring back to any of the fourteenth to the seventeenth aspect, the MEMS structure may allow converting between acoustic signals and electrical signals.

As the description refers to illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A sound transducer,
comprising a housing and a MEMS structure,
wherein a sound port is disposed in the housing,
wherein the MEMS structure is disposed in an interior space of the housing,
wherein the MEMS structure and the sound port are acoustically coupled to each other,
wherein the MEMS structure separates a front volume of the housing from a back volume of the housing, wherein at least one vent hole of the MEMS structure allows a gas exchange between the front volume and the back volume, wherein the sound port allows a liquid to enter the front volume, and wherein the MEMS structure prevents liquid from entering the back volume from the front volume.

2. The sound transducer of claim 1,
wherein the MEMS structure provides a liquid tight seal between the front volume and the back volume.

3. The sound transducer of claim 1,
wherein the vent hole is disposed in a diaphragm of the MEMS structure.

4. The sound transducer of claim 3,
wherein the diaphragm is a membrane or a back plate.

5. The sound transducer of claim 1,
wherein at least a part of a surface of the MEMS structure adjacent the front volume is covered with a hydrophobic coating.

6. The sound transducer of claim 5,
wherein the hydrophobic coating comprises a self-assembled monolayer.

7. The sound transducer of claim 1,
wherein at least a part of a surface of the MEMS structure facing the sound port comprises a hydrophobic structure.

8. The sound transducer of claim 7,
wherein the hydrophobic structure comprises a plurality of pillars configured to repel liquid.

9. The sound transducer of claim 8,
wherein the plurality of pillars closes manufacturing holes of the MEMS structure used for at least one manufacturing step of the MEMS structure.

10. The sound transducer of claim 8, wherein the plurality of pillars comprise:
a pitch between 5 μm and 10 μm;
a diameter between 1 μm and 3 μm; and
a height between 0.5 μm and 5 μm.

11. The sound transducer of claim 1,
wherein a sidewall of the vent hole comprises a hydrophobic structure.

12. The sound transducer of claim 10,
wherein the hydrophobic structure comprises pillars with inwardly-dented or concave tops.

13. The sound transducer of claim 1,
wherein the vent hole belongs to a plurality of vent holes being disposed in a diaphragm of the MEMS structure, and wherein the plurality of vent holes allows the gas exchange between the front volume and the back volume.

14. The sound transducer of claim 13,
wherein a size of the vent holes prevents passage of liquid through the vent holes.

15. The sound transducer of claim 1, wherein a surface of the MEMS structure directly facing the sound port comprises a movable membrane of the MEMS structure.

16. The sound transducer of claim 1, wherein a diaphragm of the MEMS structure comprises a hydrophobic structure that prevents the liquid from entering the back volume from the front volume.

17. A sound transducer,
comprising a housing and a MEMS structure,
wherein at least one vent hole is disposed in a diaphragm of the MEMS structure, and
wherein a sidewall of the vent hole of the diaphragm of the MEMS structure comprises a hydrophobic structure configured to prevent liquid from passing from a front volume of the housing to a back volume of the MEMS structure through the diaphragm via the vent hole of the diaphragm.

18. The sound transducer of claim 17,
wherein the hydrophobic structure comprises a plurality of pillars.

19. The sound transducer of claim 17,
wherein the sidewall of the vent hole is made as the hydrophobic structure.

20. The sound transducer of claim 17,
wherein the diaphragm is a membrane or a back plate.

21. The sound transducer of claim 17,
wherein the MEMS structure allows converting between acoustic signals and electrical signals.

22. The sound transducer of claim 17, wherein at least a part of an external surface of the MEMS structure comprises a plurality of pillars configured to repel liquid.

23. The sound transducer of claim 22, wherein the plurality of pillars comprise:
a pitch between 5 μm and 10 μm;
a diameter between 1 μm and 3 μm; and
a height between 0.5 μm and 5 μm.

24. The sound transducer of claim 22, wherein the external surface of the MEMS structure comprises a movable membrane of the MEMS structure.

25. The sound transducer of claim 17, wherein the housing comprises a port configured to allow liquid to enter the housing.

* * * * *